US012760437B2

(12) United States Patent
Oberst et al.

(10) Patent No.: US 12,760,437 B2
(45) Date of Patent: Oct. 13, 2026

(54) SELF-LUBRICATING COATING, FABRICATION METHOD, AND ELECTRICAL CONTACT

(71) Applicant: TE Connectivity Solutions GmbH, Schaffhausen (CH)

(72) Inventors: Marcella Joana Oberst, Bensheim (DE); Isabell Buresch, Woert (DE); Frank Ostendorf, Bensheim (DE); Helge Schmidt, Speyer (DE)

(73) Assignee: TE Connectivity Solutions GmbH, Schaffhausen (CH)

( * ) Notice: Subject to any disclaimer, the term of this patent is extended or adjusted under 35 U.S.C. 154(b) by 152 days.

(21) Appl. No.: 18/433,508

(22) Filed: Feb. 6, 2024

(65) Prior Publication Data

US 2024/0263335 A1 Aug. 8, 2024

(30) Foreign Application Priority Data

Feb. 8, 2023 (DE) ......................... 102023103001.9

(51) Int. Cl.
*C25D 15/00* (2006.01)
*C10M 103/02* (2006.01)
(Continued)

(52) U.S. Cl.
CPC ........... *C25D 15/00* (2013.01); *C10M 103/02* (2013.01); *C10M 103/04* (2013.01);
(Continued)

(58) Field of Classification Search
CPC .......... C25D 15/00; C25D 7/006; C25D 9/04; C25D 3/46; C25D 15/02; C25D 5/615;
(Continued)

(56) References Cited

U.S. PATENT DOCUMENTS 3,787,294 A 1/1974 Kurosaki et al.

FOREIGN PATENT DOCUMENTS

CN 102077423 A 5/2011
CN 107312949 A 11/2017
(Continued)

OTHER PUBLICATIONS

Extended European Search Report for European Application No. 24155347.8 dated Jul. 5, 2024.
(Continued)

*Primary Examiner* — Taiwo Oladapo
(74) *Attorney, Agent, or Firm* — Potomac Law Group PLLC

(57) ABSTRACT

The present invention relates to a self-lubricating coating comprising a dispersion made of nanoparticles containing sulfur that are incorporated into a silver matrix, wherein the nanoparticles containing sulfur have the composition $Ag_2S$ and/or $Au_2S$. The present invention furthermore relates to a self-lubricating coating comprising a dispersion made of fluorinated graphene, and/or carbon nanotube (CNT), and/or carbon nanoparticles of the formula $(CF)_x$ incorporated into a silver matrix, wherein the fluorinated graphene, CNT, or carbon nanoparticles of the formula $(CF)_x$ have a fluorine to carbon ratio of 1 to 1.25. The present invention furthermore relates to a method for the fabrication of the coating, and an electrical contact which comprises such a coating.

19 Claims, 1 Drawing Sheet

(51) Int. Cl.

| | |
|---|---|
| ***C10M 103/04*** | (2006.01) |
| ***C10M 103/06*** | (2006.01) |
| ***C23C 14/06*** | (2006.01) |
| ***C23C 14/14*** | (2006.01) |
| ***C23C 16/06*** | (2006.01) |
| ***C23C 16/30*** | (2006.01) |
| ***C25D 7/00*** | (2006.01) |
| ***C25D 9/04*** | (2006.01) |
| ***H01R 13/03*** | (2006.01) |
| *C10N 20/06* | (2006.01) |
| *C10N 50/02* | (2006.01) |

(52) U.S. Cl.

CPC ....... *C10M 103/06* (2013.01); *C23C 14/0623* (2013.01); *C23C 14/14* (2013.01); *C23C 16/06* (2013.01); *C23C 16/305* (2013.01); *C25D 7/006* (2013.01); *C25D 9/04* (2013.01); *H01R 13/03* (2013.01); *C10M 2201/0423* (2013.01); *C10M 2201/053* (2013.01); *C10M 2201/0653* (2013.01); *C10N 2020/06* (2013.01); *C10N 2050/02* (2013.01)

(58) Field of Classification Search

CPC ............. C10M 103/02; C10M 103/04; C10M 103/06; C10M 2201/0423; C10M 2201/053; C10M 2201/0653; C10M 125/00; C10M 2201/041; C10M 2201/05; C10M 2201/065; C10M 125/22; C23C 14/0623; C23C 14/14; C23C 16/06; C23C 16/305; H01R 13/03; C10N 2020/06; C10N 2050/02; C10N 2010/06; C10N 2020/061; C10N 2050/023; B82Y 30/00; C08K 3/04; C08K 2003/3009; C08K 3/041; C08K 3/042; C08K 2201/011; C09D 1/00; C09D 5/00; C09D 5/24; C09D 7/61; C09D 7/67; C09D 7/68; C09D 7/69; C09D 7/70; C09D 7/66; C09D 7/62; H01H 1/027; H01H 1/023; H01B 1/02

See application file for complete search history.

(56) References Cited

FOREIGN PATENT DOCUMENTS

| | | | | |
|---|---|---|---|---|
| CN | 110194931 | A | 9/2019 | |
| CN | 112368422 | A | 2/2021 | |
| DE | 10346206 | A1 | 4/2005 | |
| DE | 102007002111 | A1 | 7/2008 | |
| DE | 102008030988 | B4 | 4/2010 | |
| DE | 102014110651 | | 7/2015 | |
| DE | 102018005348 | A1 | 1/2020 | |
| DE | 102019130506 | A1 | 5/2021 | |
| EP | 0737759 | B1 | 11/2001 | |
| EP | 2634293 | B1 | 7/2018 | |
| EP | 4328934 | A1 | 2/2024 | |
| FR | 3103063 | A1 | 5/2021 | |
| GB | 956568 | A | 4/1964 | |
| WO | 8606419 | A1 | 11/1986 | |
| WO | 2009156386 | A1 | 12/2009 | |
| WO | WO-2017007011 | A1 * | 1/2017 | .............. B22F 1/052 |
| WO | 2020007408 | A2 | 1/2020 | |

OTHER PUBLICATIONS

Search Report for German Application No. 102023103001.9, dated Apr. 8, 2023.

Office Action for Chinese Patent Application No. 202410168466.6 issued on Mar. 12, 2026 (includes English language translation).

* cited by examiner

SELF-LUBRICATING COATING, FABRICATION METHOD, AND ELECTRICAL CONTACT

This application claims priority to DE Application Ser. No. 102023103001.9 filed on Feb. 8, 2023 which is incorporated herein by reference in its entirety.

The invention relates to a self-lubricating coating, a method for the fabrication of the coating; and an electrical contact comprising such a coating.

Electrical connectors with numerous configurations are known. Electrical connectors are intended to establish an electrical connection when in the plugged state. Electrical connectors are generally used for either signal transmission or power transmission. For this purpose, electrical connectors typically comprise electrically conductive contact elements that come into contact with one another when the connector is plugged together. The contact elements of one connector element are often configured as contact pins and those of the counterpart as a socket in one part or in two parts with a contact spring inserted. When the connector and the socket are plugged together, the contact springs exert resilient spring forces upon the contact pins to ensure a reliable electrically conductive connection.

Electrical connectors are used, for example, in motor vehicles to transmit energy and to interconnect electrical and electronic systems. In motor vehicles, connectors are subjected to strong temperature fluctuations, vibrations, moisture, as well as corrosive media. An increase in the operating temperatures results in an increase in the contact resistance, in particular with the widely used tin-plated copper-based contact elements.

A silver coating has been proposed, in particular for high-current contact elements, which leads to desired electrical properties such as low electrical resistance and contact resistance. A pure silver coating has good electrical properties, but disadvantageous tribological properties. This can lead to contact problems if the elements of the connector are plugged together frequently or if vibrational loads arise. Therefore, a silver sulfide film, the so-called “blue silver”, was proposed as an additional coating on top of the silver coating. This initially leads to a reduction in the insertion force and to a stable low contact resistance. Alternatively, graphite particles can be added to the silver coating to achieve improved wear behavior and permanently low contact resistance.

However, known dispersions with graphite particles are difficult to use for producing a coating or to handle during subsequent processing, which complicates and limits the coating processes and makes them more expensive.

Furthermore, it was proposed to add particles made of hexagonal boron nitride (hBN), silicon carbide (SiC), or tungsten (IV) sulfide ($WS_2$) to the silver coating in order to obtain improved wear behavior and low contact resistance. However, these additives do not sufficiently demonstrate the desired improvements in the electrical properties of an electrical contact coated in this manner.

There is therefore a need for a self-lubricating composition for a coating for electrical contacts, preferably for high-current contacts, as well as for an inexpensive, simplified, and reliable method for their fabrication with which the contact surface of an electrical connector is treated such that a further reduction in the plugging force and a low contact resistance is obtained.

This object is solved by the subject matter of the independent claims. Advantageous further developments of the present invention are the object of the dependent claims.

For a better understanding of the present invention, it shall be explained in more detail with reference to the embodiments shown in the following figures. Same parts are provided with the same reference characters and the same component names. Furthermore, some features or combinations of features from the different embodiments shown and described can in themselves represent solutions that are independent, inventive, or according to the invention, where FIG. 1 shows an example of a silver coating with an $Ag_2S$ coating disposed thereon;

According to the invention, the present invention in one embodiment provides a self-lubricating coating comprising a dispersion made of nanoparticles containing sulfur that are incorporated into a silver matrix, where the nanoparticles containing sulfur are selected form $Ag_2S$ and/or $Au_2S$. The nanoparticles containing sulfur are dispersed in the silver matrix and are therefore homogeneously distributed in the coating formed therefrom.

Figure 1:
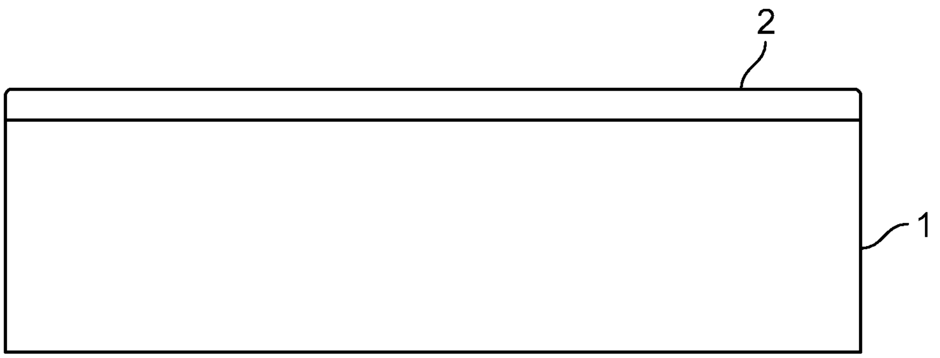
Figure 2:
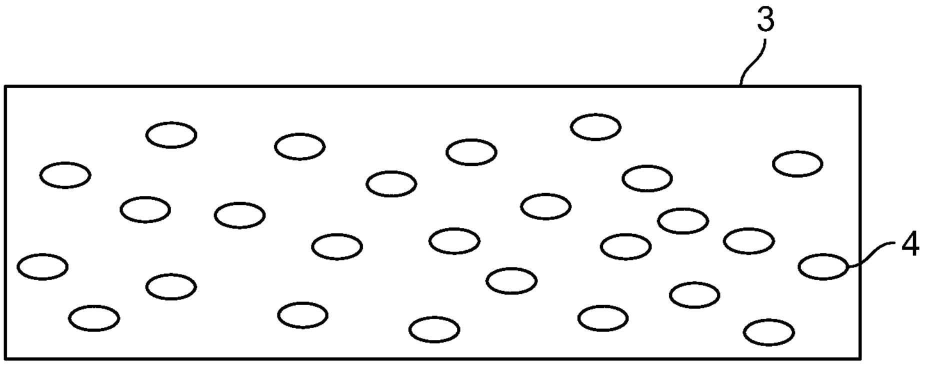
FIG. 2 shows an example of a silver coating with graphite particles dispersed therein.
Figure 3:
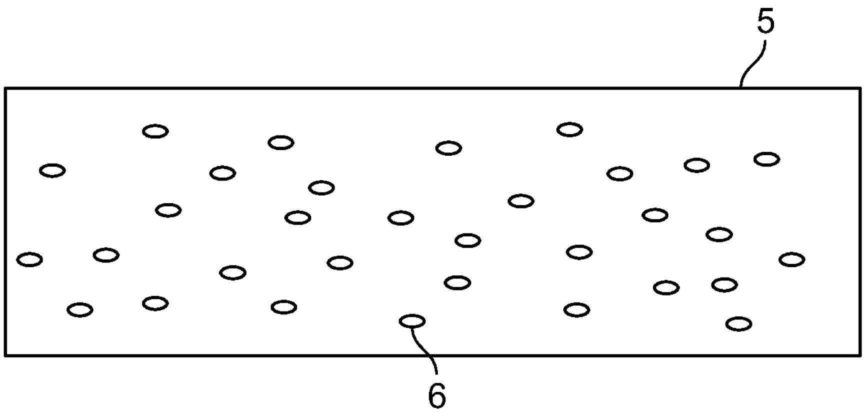
FIG. 3 shows an example of a silver coating of nanoparticles dispersed therein in accordance with the present invention.

FIG. 1 shows a silver coating 1 with an $Ag_2S$ coating 2 disposed thereon, as is known from prior art. FIG. 2 shows an example of a silver coating 3 with graphite particles 4 dispersed therein. For comparison, FIG. 3 shows a silver coating 5 with nanoparticles 6 dispersed therein in accordance with the present invention. These nanoparticles 6 comprise, for example, nanoparticles containing sulfur or fluorinated carbon nanoparticles, e.g. fluorinated graphene, carbon nanotube (CNT), or carbon nanoparticles of the formula $(CF)_x$.

The nanoparticles containing sulfur are preferably contained as a dispersion at a quantity of 0.01 to 10% by volume, more preferably at a quantity of 0.1 to 8% by volume, even more preferably at a quantity of 0.5 to 6% by volume based on 100% by volume of the coating. The nanoparticles containing sulfur impart self-lubricating properties upon the coating.

The nanoparticles containing sulfur preferably have an average particle size D50 of 20 to 150 nm, more preferably an average particle size D50 of 40 to 120 nm, even more preferably an average particle size D50 of 50 to 90 nm. The average particle size D50 can be determined using a method such as is described in DIN ISO 9276-2:2018-09.

According to the invention, the present invention provides a self-lubricating coating in a further embodiment comprising a silver-based dispersion coating composed of fluorinated graphene, carbon nanotube (CNT), or carbon nanoparticles of the formula $(CF)_x$ incorporated into a silver matrix, where fluorinated graphene, CNT, or carbon nanoparticles of the formula $(CF)_x$ with a fluorine to carbon ratio of 1 to 1.25 can be used. The fluorinated graphene, CNT, or carbon nanoparticles are dispersed in the silver matrix and therefore homogeneously distributed in the coating formed therefrom. Fluorinated carbon nanoparticles of the formula $(CF)_x$ having a fluorine to carbon ratio of at least 1 to 1.25 exhibit excellent thermal stability, are corrosion-free in strongly alkaline and acidic environments, and exhibit excellent self-lubricating properties. Fluorinated carbon nanoparticles of the formula $(CF)_x$, on the other hand having a fluorine to carbon ratio of less than 1 exhibit significantly poorer thermal stability and are therefore unsuitable as a lubricant.

The fluorinated nanoparticles are preferably contained in the dispersion at a quantity of 0.01 to 10% by volume, more preferably at a quantity of 0.1 to 8% by volume, even more preferably at a quantity of 0.1 to 5% by volume, based on 100% by volume of the coating. The fluorinated carbon nanoparticles impart self-lubricating properties upon the coating.

The fluorinated carbon nanoparticles preferably have a bimodal particle size distribution and where the bimodal distribution is 5 nm to 10 nm and 50 nm to 10 μm or 20 nm to 50 nm and 100 nm to 15 μm.

The fluorinated carbon nanoparticles of the formula $(CF)_x$ preferably have a fluorine to carbon ratio of ≥1.0, more preferably from 1 to 1.25.

The coating preferably comprises carbon nanoparticles of the formula $(CF)_x$ incorporated into a silver matrix.

The particle concentration of the carbon nanoparticles of the formula $(CF)_x$ is preferably 0.01 to 5% by weight of the coating.

In the above embodiments, the silver particles are preferably contained at a quantity of 90 to 99.9% by volume, based on 100% by volume of the coating.

The coatings according to the invention advantageously show improved wear behavior while maintaining the low contact resistance of pure silver.

Furthermore, the self-lubricating coating can comprise a dispersing agent. Suitable dispersing agents are of polar origin, where preferred dispersing agents are organic solvents containing nitrogen such as N-methylpyrrolidone.

The present invention also provides a coating comprising a layer comprising silver and nanoparticles, where the nanoparticles are nanoparticles containing sulfur selected from $Ag_2S$ and $Au_2S$, or are fluorinated carbon nanoparticles of the formula $(CF)_x$, and have a fluorine to carbon ratio from 1 to 1.25.

The coating preferably comprises nanoparticles containing sulfur selected from $Ag_2S$ and $Au_2S$, or carbon nanoparticles of the formula $(CF)_x$ having a fluorine to carbon ratio of 1 to 1.25.

The coating can additionally comprise at least one intermediate layer which is preferably composed of nickel, pure silver, or copper and where the former preferably has a thickness of 0.5 to 4 micrometers, more preferably a thickness of 1.0 to 3 micrometers, and the silver layer containing the dispersion that is disposed thereabove has a layer thickness of 0.5 to 25 μm, more preferably a thickness of 0.5 to 4 μm or 5 to 25 μm.

In addition, the coating can comprise a multilayer system which comprises further layers in addition to a layer comprising silver and a layer fabricated with the coating according to the invention. According to a further advantageous embodiment, the intermediate layers comprise tin, and/or nickel or NiP (nickel phosphorus), and/or silver, and/or copper, and/or alloys of tin, nickel, silver, copper. These materials are rust and heat resistant, which guarantees the longevity of the connector. An intermediate layer preferably comprises nickel and an intermediate layer thereabove comprises silver. The intermediate layers each preferably have a thickness of 0.5 to 4 micrometers, more preferably a thickness of 1.0 to 3 micrometers.

Advantageously, the coatings fabricated with the coatings according to the invention exhibit improved wear behavior while maintaining the low contact resistance of pure silver.

The present invention furthermore provides an electrical contact comprising the coating according to the invention.

The present invention finally provides a method for the fabrication of the coating according to the invention, comprising coating a substrate with the coating according to the invention. In particular, the present invention comprises a method for surface treatment of an electrically conductive contact element for an electrical connector, where the electrically conductive contact element has a metallic contact surface. In addition, the coating according to the invention is applied to at least a partial region of the contact surface of the electrically conductive contact element.

The coating is preferably produced by electrolytic deposition, or is produced by physical deposition using PVD, CVD or plasma deposition.

The $AgS_2$ or $AuS_2$ nanoparticles are preferably masked such that a positive zeta potential is established in the pH range of the coating bath. This is necessary to avoid an agglomeration of the particles among each other or an undesirable chemical reaction and, as a result of the electrical forces of attraction, co-deposition of the nanoparticles at the cathode takes place in the silver matrix. Process analysis methods such as photon correlation spectroscopy (PCS) as well as laser Doppler anemometry (LDA) are necessary for controlled deposition.

The coatings of the present invention exhibit superior wear resistance and low contact resistance while simplifying the coating method and the processing. The coatings according to the invention also have excellent electrical properties that are particularly suitable for high-current contacts.

The coatings according to the invention allow for electrical contacts with a high number of plugging connections to be plugged at the same time and connector cycles of up to 50,000, applications with high vibration loads, and application temperatures of up to 200° C. The lugging connections can be any type of plugging connections already known in prior art.

LIST OF REFERENCE CHARACTERS

| Reference character | Description |
|---|---|
| 1 | silver coating |
| 2 | $Ag_2S$ coating |
| 3 | silver coating with dispersed particles |
| 4 | graphite particles |
| 5 | silver coating with dispersed nanoparticles |
| 6 | nanoparticles |

The invention claimed is:

1. Self-lubricating coating comprising a dispersion made of nanoparticles containing sulfur that are incorporated in a silver matrix, wherein said nanoparticles containing sulfur have the composition $Au_2S$.

2. Self-lubricating coating according to claim 1, wherein said nanoparticles containing sulfur are contained in said dispersion at a quantity of 0.01 to 10% by volume, based on 100% by volume of the dispersion coating.

3. Self-lubricating coating according to claim 1, wherein said nanoparticles containing sulfur have an average particle size D50 of 5 to 300 nm.

4. Self-lubricating coating according to claim 1, wherein said nanoparticles containing sulfur have an average particle size D50 of 50 to 90 nm.

5. Self-lubricating coating, comprising a dispersion made with fluorinated graphene, and/or carbon nanotube (CNT), and/or carbon nanoparticles of the formula $(CF)_x$ incorporated into a silver matrix, wherein said fluorinated graphene, CNT, or carbon nanoparticles of the formula $(CF)_x$ have a fluorine to carbon ratio of 1 to 1.25.

6. Self-lubricating coating according to claim 5, wherein said fluorinated carbon nanoparticles have a bimodal particle size distribution, and wherein the average particle size D50 is from 2 to 50 nm and from 0.4 to 10 μm.

7. Self-lubricating coating according to claim 5, wherein fluorinated carbon nanoparticles of the formula $(CF)_x$ have a fluorine to carbon ratio of 1 to 1.25.

8. Self-lubricating coating according to claim 5, wherein said dispersion comprises fluorinated carbon nanoparticles of the formula $(CF)_x$.

9. Self-lubricating coating according to claim 1, wherein the silver content in the matrix is present at a quantity of 90 to 99.99% by volume, based on 100% by volume of said dispersion coating.

10. Self-lubricating coating according to claim 1, wherein said coating further comprises a dispersing agent.

11. Self-lubricating coating according to claim 10, wherein said dispersing agent is selected from the group of polar dispersing agents.

12. Coating comprising a dispersion layer comprising silver and nanoparticles, wherein said nanoparticles are nanoparticles containing sulfur selected from $Au_2S$, or are fluorinated graphene, and/or fluorinated carbon nanotube (CNT), and/or fluorinated carbon nanoparticles of the formula $(CF)_x$ that have a fluorine to carbon ratio of 1 to 1.25, wherein said fluorinated graphene, and/or fluorinated carbon nanotube (CNT), and/or fluorinated carbon nanoparticles of the formula $(CF)_x$ have a bimodal particle size distribution, and wherein the average particle size D50 is from 2 to 50 nm and from 0.4 to 10 μm.

13. Coating according to claim 12, wherein said dispersion comprises fluorinated carbon nanoparticles of the formula $(CF)_x$.

14. Coating according to claim 12, wherein said coating furthermore comprises an additional layer comprising nickel, nickel phosphorus, copper, or pure silver, where this layer preferably has a thickness of 1 to 4 micrometers.

15. Coating according to claim 12, wherein said coating comprises two intermediate layers between a layer comprising silver and said layer produced with said coating of claim 12, wherein said first intermediate layer preferably comprises nickel, and wherein said first intermediate layer preferably has a thickness of 0.5 to 4 micrometers, wherein the second intermediate layer preferably comprises silver, and wherein said second intermediate layer preferably has a thickness of 0.5 to 4 micrometers.

16. Electrical contact comprising said coating according to claim 1.

17. Method for the fabrication of a coating according to claim 1, comprising coating a substrate with said coating according to claim 1.

18. Method according to claim 17, wherein said coating is fabricated by electrolytic deposition.

19. Method according to claim 17, wherein said coating is fabricated by physical deposition using PVD (physical vapor deposition), CVD (chemical vapor deposition) or plasma deposition.

* * * * *